United States Patent [19]

Ishimura et al.

[11] Patent Number: 5,686,752

[45] Date of Patent: Nov. 11, 1997

[54] SEMICONDUCTOR DEVICE HAVING A CMOS ELEMENT AS A BUFFER

[75] Inventors: Tamihiro Ishimura; Sampei Miyamoto, both of Tokyo, Japan

[73] Assignee: Oki Electric Industry Co., Ltd., Tokyo, Japan

[21] Appl. No.: 576,614

[22] Filed: Dec. 21, 1995

[30] Foreign Application Priority Data

Dec. 27, 1994 [JP] Japan ..................... 6-325573

[51] Int. Cl.$^6$ ............................ H01L 29/76; H01L 29/94
[52] U.S. Cl. .................... 257/369; 257/371; 327/534; 327/565; 327/566
[58] Field of Search ...................... 324/534, 565, 324/566; 257/369, 371

[56] References Cited

U.S. PATENT DOCUMENTS

| | | | |
|---|---|---|---|
| 5,039,877 | 8/1991 | Chern | 307/206.2 |
| 5,473,183 | 12/1995 | Yonemoto | 257/371 |
| 5,510,630 | 4/1996 | Agarwal et al. | 257/296 |

FOREIGN PATENT DOCUMENTS

| | | | |
|---|---|---|---|
| 2632448 | 1/1977 | Germany | 257/369 |
| 6-177335 (A) | 6/1994 | Japan . | |

*Primary Examiner*—Wael Fahmy
*Assistant Examiner*—Fetsum Abraham
*Attorney, Agent, or Firm*—Rabin, Champagne & Lynt, P.C.

[57] ABSTRACT

A PMOS 21 and an NMOS 22, which are connected in series between a power supply potential Vcc and a ground potential Vss, perform ON and Off operation in accordance with data signals G1 and G2 from an output buffer control circuit 40, and generate an output signal. A Vpp generating circuit 50 generates a potential Vpp higher than the power supply potential Vcc and a back gate bias of the PMOS 21 is set at the potential Vpp. Even if a latch-up trigger current due to a surge voltage is produced, the back gate bias of the PMOS 21 is set at Vpp and therefore a potential difference caused in an N type well resistor becomes small and a base potential of a parasitic bipolar transistor disposed between the N type well 2 and a substrate 1 becomes approximate to the potential Vpp. Accordingly, the current which flows into the substrate 1 is suppressed and a latch-up tolerance is improved.

14 Claims, 7 Drawing Sheets

SEMICONDUCTOR DEVICE HAVING A CMOS ELEMENT AS A BUFFER

REFERENCE TO RELATED APPLICATION

This application claims the priority right under 35 U.S.C. 119, of Japanese Patent Application No. Hei. 06-325573 filed on Dec. 27, 1994, the entire disclosure of which is incorporated herein by reference.

BACKGROUND OF THE INVENTION

1. Field of the Invention

The present invention relates to a semiconductor device and, more particularly, a semiconductor device incorporating an output buffer therein constituted of a CMOS (Complementary Metal Oxide Semiconductor) IC.

2. Description of the Related Art

A semiconductor device which has an output buffer constituted of a conventional CMOS (hereafter referred to as "CMOS output buffer") is formed on, for example, a P type substrate. This CMOS output buffer is provided with a P channel type field effect transistor (hereafter referred to as "PMOS") and an N channel type field effect transistor (hereafter referred to as "NMOS") which are connected in series between a power supply potential Vcc and a ground potential Vss. The drains of PMOS and NMOS are connected with each other and connected to the output terminal and the sources of PMOS and NMOS are connected to the power supply potential Vcc and the ground potential Vss, respectively.

An N type well is formed on the P type substrate. The PMOS is formed in the N type well and the N type well is biased to the power supply potential Vcc. On the other hand, the P type substrate is biased to a negative potential Vbb so that a circuit between the N type well and the P type substrate is not forward-biased even if a potential of an input pin undershoots. When the potentials to be supplied to the gates of PMOS and NMOS remain at the level of the ground potential Vss, a high level signal is output from the output terminal and, when the potentials to be supplied to the respective gates remain at the level of the potential Vcc, a low level signal is output.

However, the semiconductor device having the conventional CMOS output buffer includes a shortcoming as described below.

In a dynamic random access memory (hereafter referred to as "DRAM") where the negative potential Vbb is produced on-chip, the output buffer constituted of the CMOS includes a shortcoming that a latch-up resistance against a positive surge caused due to static electricity or the like is low.

Figure 1:
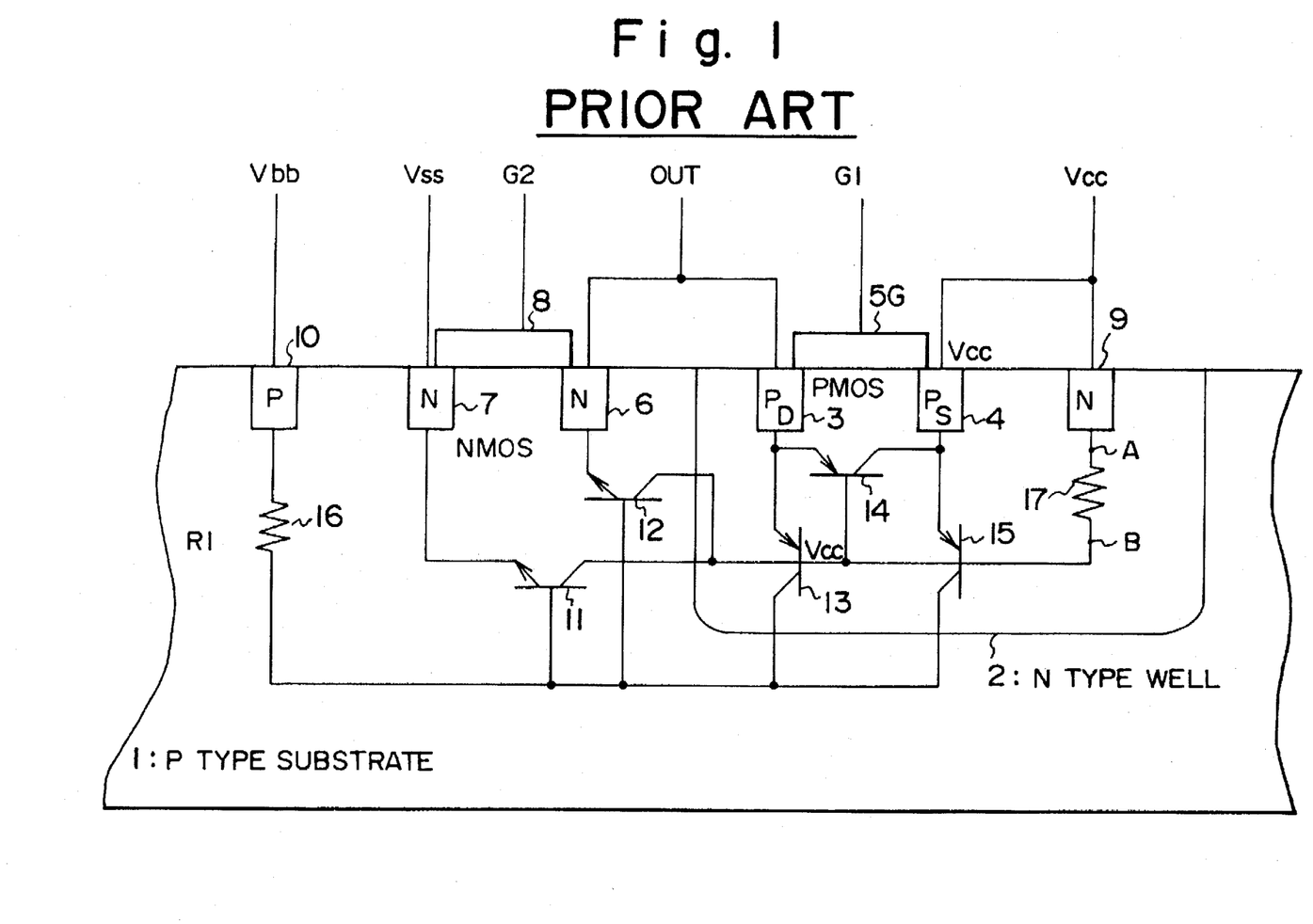
FIG. 1 is a cross sectional view illustrating an output buffer pertained to a prior art used for explaining a latch-up phenomenon.

FIG. 1 is a cross sectional view of the output buffer for depicting a latch-up phenomenon and the following describes a problem of the prior art, referring to this drawing.

FIG. 1 shows a P type substrate 1 and an N type well 2 formed therein. A PMOS having a drain 3, a source 4 and a gate 5 is formed in the N type well 2 and an NMOS having a drain 6, a source 7 and a gate 8 is formed on the P type substrate 1. An active region 9 connected to the bias potential Vcc is formed in an N type well 2 and an active region 10 connected to the bias potential Vbb is formed on the P type substrate 1. The CMOS output buffer having such configuration includes parasitic bipolar transistors 11, 12, 13, 14 and 15 as shown in FIG. 1. Transistors 11 and 12 respectively serve as an n-p-n type bipolar transistor and transistors 13 to 15 respectively serve as a p-n-p type bipolar transistor.

In this case, it is assumed that the ON voltage of the bipolar transistor, that is, a built-in potential is BP (generally, approximately 0.8 V) and a threshold voltage of the PMOS is Vtp. When the positive surge voltage from an output terminal OUT rises up to approximately Vcc+BP in case of voltage Vtp>BP, transistors 13 and 14 turn on before the PMOS turns on. A current flowing through the transistor 14 flows into the power supply Vcc and a current flowing through the transistor 13 flows into the substrate 1. In this case, the currents flowing in the transistors 13 and 14 have different potentials and therefore the current flowing in the transistor 13 is larger than that in the transistor 14. In other words, a greater part of the current flows into the substrate 1. The current supplying capacity of a bias potential Vbb generating circuit (not shown) is not so high because a stand-by current is controlled to be low. When a current flowing into the substrate 1 due to a positive surge is compared with the current supplying capacity of the bias potential Vbb generating circuit, the current flowing into the substrate 1 is absolutely larger and, since the resistance value of the substrate resistance 16 is generally so large, the potential of the base of the transistor 11 steeply rises. When the current flows into the substrate 1, the potential Vbb of the substrate 1 steeply rises and the transistor 11 turns on. The current flows in a path of the power supply Vcc→N type well resistor 17→transistor 11→ground potential Vss and this current serves as a trigger current of the latch-up phenomenon.

The N type well resistor 17 has a comparatively large resistance and, when the trigger current flows, a potential difference in accordance with a quantity of trigger current is caused at both end points A and B of the resistor 17. Therefore, the base potential of the transistor 15 becomes low. On the other hand, the potential of the emitter of the transistor 15 is the power supply potential Vcc and, if a difference potential which is produced between the base and the emitter is larger than the voltage BP, the transistor 15 turns on. Accordingly, a current flows from the power supply potential Vcc to the substrate 1, and the potential Vbb of the substrate 1 rises again. Consequently, the current flows in the path of the power supply Vcc→N type well resistance 17→transistor 11→ground potential Vss, and the potential difference between points A and B becomes further larger, finally resulting in the latchup, and the current continuously flows from the power supply potential Vcc to the ground potential Vss. As a result, the semiconductor device generates heat and may be damaged.

On the other hand, though the latch-up is not caused since the PMOS turns on before the bipolar transistor turns on in case of voltage Vtp<BP, the current which flows from the output terminal OUT into the power supply potential Vcc is liable to leak from the output pin when the threshold voltage Vtp of the PMOS is lowered, and the output buffer may malfunction.

SUMMARY OF THE INVENTION

An object of the present invention is to solve the shortcomings of the prior art as described above and to provide a semiconductor device which excels in reliability and durability by improving a latch-up tolerance thereof.

A semiconductor device comprises a first MOS transistor of a first conductivity type and a second MOS transistor of a second conductivity type, the first MOS transistor and the second MOS transistor being connected in series between a first power supply potential and a second power supply potential lower than the first power supply potential, wherein a back gate bias of the first MOS transistor is set to a third power supply potential higher than the first power supply potential.

A semiconductor device comprises a first MOS transistor of a first conductivity type and a second MOS transistor of a second conductivity type, the first MOS transistor and the second MOS transistor being connected in series between a first power supply potential and a second power supply potential lower than said first power supply potential, and an active region for setting a back gate bias of the first MOS transistor formed so as to surround the first MOS transistor in a well in which the first MOS transistor is formed.

A semiconductor device comprises a first MOS transistor of a first conductivity type, a second MOS transistor of a second conductivity type, the first MOS transistor and the second MOS transistor being connected in series between a first power supply potential and a second power supply potential lower than the first power supply potential, and a third MOS transistor of the first conductivity type connected in parallel with the first MOS transistor and provided between the first power supply potential and the second power supply potential, the gate of the third MOS transistor being connected to the first power supply potential and a back gate bias of the third MOS transistor being set at a third power supply potential higher than the first power supply potential.

The semiconductor device is configured as described above and, therefore, in a first aspect of the present invention, the base potential of a parasitic bipolar transistor disposed between the first MOS transistor in the output buffer and the substrate is higher than in a case that the back gate bias of the first MOS transistor is set to the first power supply potential even when a trigger current is produced by a surge voltage. Accordingly, the current which flows through this parasitic transistor is reduced.

According to a second aspect of the invention, a well resistance is reduced and a potential difference caused due to the well resistance becomes small by forming an active region, which supplies the back gate bias of the first MOS transistor, at the periphery of the first MOS transistor. Therefore, the base potential of the parasitic bipolar transistor disposed between the first MOS transistor in the output buffer and the substrate becomes high and the current flowing through the parasitic bipolar transistor disposed between the first MOS transistor and the substrate is reduced.

According to a third aspect of the invention, when the surge voltage is produced at the output terminal, a current flows in the first power supply potential through the parasitic bipolar transistor disposed between the drain and the source of the first MOS transistor and the parasitic bipolar transistor disposed between the drain and the source of the third MOS transistor. Accordingly, the current which flows from the source of the first MOS transistor to the substrate is reduced and the latch-up trigger current becomes small. Consequently the above described problem can be solved.

DETAILED DESCRIPTION OF THE PREFERRED EMBODIMENTS

First Embodiment

Figure 2A:
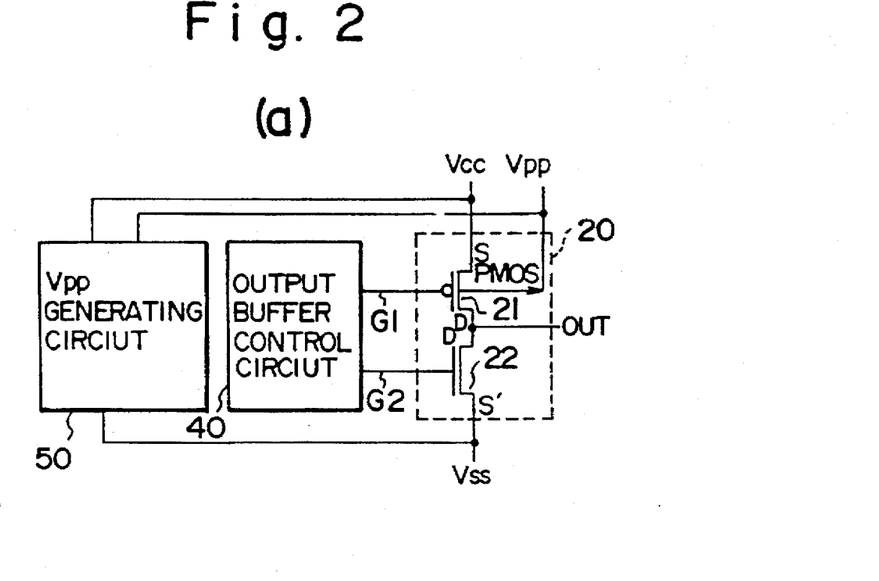
FIGS. 2a–2b are a diagram illustrating a main part of a semiconductor device according to a first embodiment of the present invention.
Figure 2B:
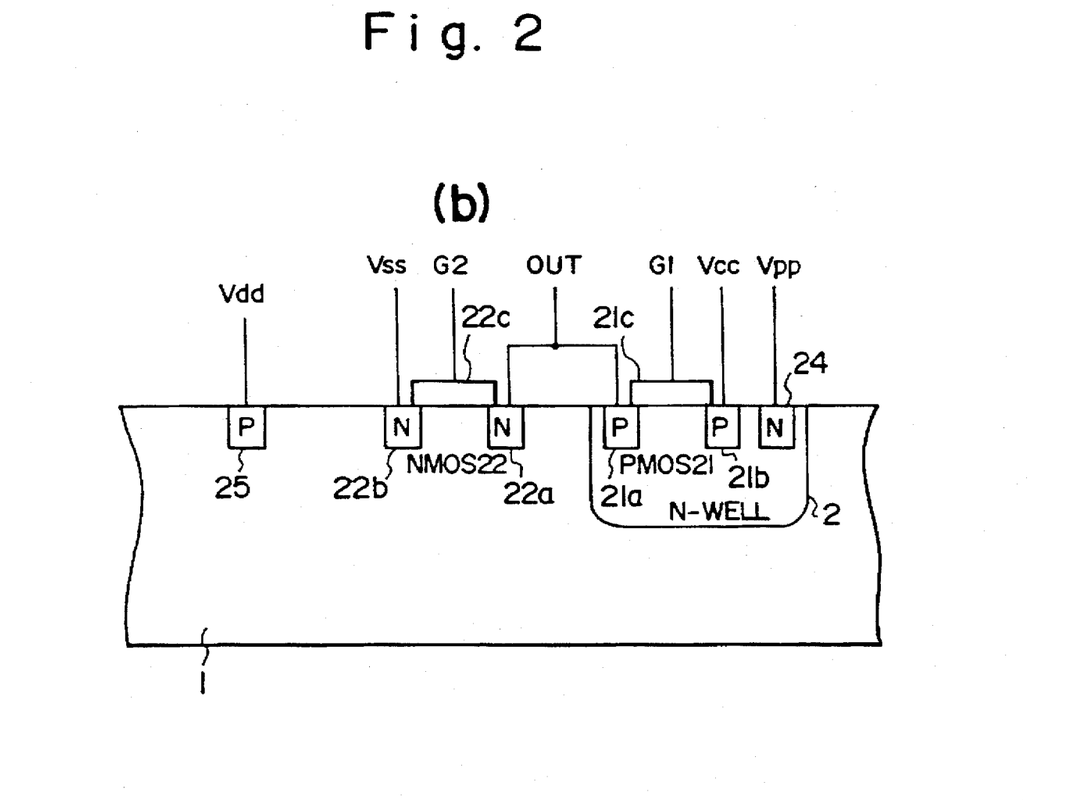

FIG. 2 shows a main part of a semiconductor device for use in a first embodiment according to the present invention. A CMOS output buffer and a peripheral circuit thereof are shown in FIG. 2(a) and a cross sectional view of the CMOS output buffer is shown in FIG. 2(b).

A CMOS output buffer 20 of the semiconductor device shown in FIG. 2 is constituted of a PMOS 21 which is a first MOS transistor and an NMOS 22 which is a second MOS transistor. These PMOS 21 and NMOS 22 are connected between a first power supply potential Vcc, for example 3.3v, and a ground potential Vss which is a second power supply potential. The source of the PMOS 21 is connected to the power supply potential Vcc and the source of the NMOS 22 is connected to the ground potential Vss. The drains of PMOS 21 and NMOS 22 are connected with each other and connected to an output terminal OUT. The gates of PMOS 21 and NMOS 22 are connected such that two outputs G1 an G2 of an output buffer control circuit 40 are entered therein. This semiconductor device is provided with an on-chip Vpp generating circuit 50 constituted, for example, of a typical booststrap circuit. The Vpp generating circuit 50 is connected between the power supply Vcc and the ground potential Vss and the third power supply potential Vpp generated by the Vpp generating circuit 50 is connected to the back gate of the PMOS 21. The Vpp generating circuit 50 has a function to output a power supply potential Vcc+α (α>0), for example 4~4.5v. That is, the output potential of the Vpp generating circuit 50 is escalated to a boosted potential Vcc+α after the power supply is turned on, the boosted potential is maintained until the power supply is turned off and the back gate of the PMOS 21 is biased. The output buffer control circuit 40 functions to control the output buffer 20, for example, to supply signals G1 and G2, which correspond to the data read from a memory array of a DRAM, to the gates of PMOS 21 and NMOS 22. The output buffer 20, the output buffer control circuit 40 and the Vpp generating circuit 50 are formed on, for example, the P type substrate 1.

The drain 21a and the source 21b of the PMOS 21 are formed in the N well 2 formed on the P type substrate 1 and the gate 21c of the PMOS 21 is formed between the drain 21a and the source 21b. On the other hand, the gate 22c of the NMOS 22 is formed between the drain 22a and the source 22b of the NMOS 22. The P type substrate 1 is biased to a negative voltage Vbb, for example −1.5v, to prevent a circuit between the P type substrate 1 and the N well 2 from being in a forward direction even though the input pin undershoots.

The following describes operation oft he semiconductor device shown in FIG. 2.

For example, data stored in a memory cell in the DRAM is read through a complementary bit line pair and a sense amplifier and supplied to the output buffer control circuit 40.

The output buffer control circuit 40 outputs data signals G1 and G2 corresponding to the read data to the gates 21c and 22c of PMOS 21 and NMOS 22, respectively. When the levels of the respective data signals G1 and G2 are the ground potential Vss, the PMOS 21 turns on and the NMOS 22 turns off. Therefore, high level signals are output from the output terminal OUT. When the levels of data signals G1 and G2 are the power supply potential Vcc, the PMOS 21 turns off and the NMOS 22 turns on. Therefore low level signals are output from the output terminal OUT.

The latch-up tolerance in the semiconductor device according to the present invention is described below. In this embodiment, the back gate bias of the PMOS 21 is set at a higher potential Vpp than the power supply potential Vcc and therefore the latch-up tolerance is improved.

Figure 3:
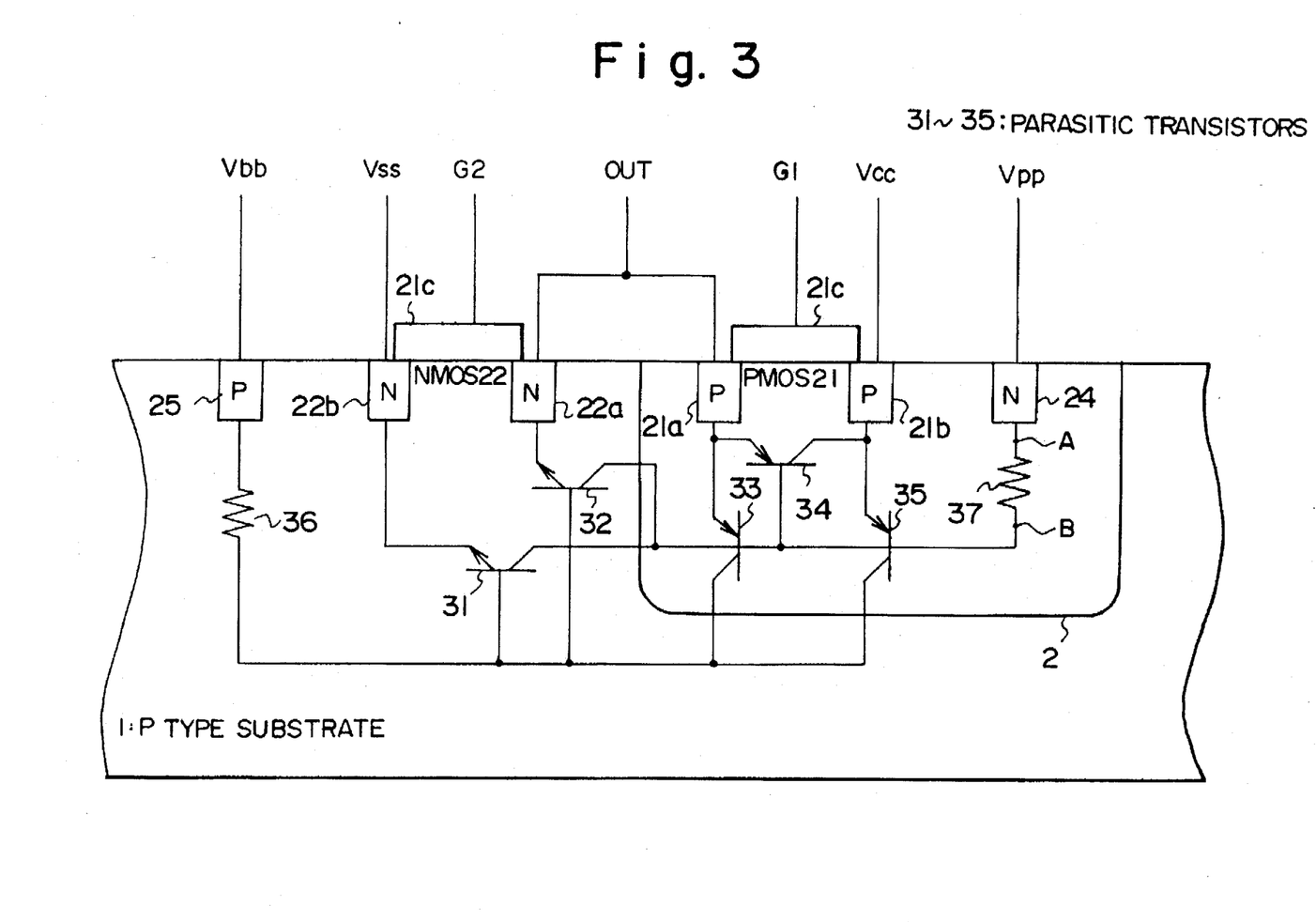
FIG. 3 is a cross sectional view illustrating the output buffer shown in FIG. 2.

FIG. 3 is a cross sectional view of the CMOS output buffer shown in FIG. 1.

In FIG. 3, there are shown the N type well 2 formed on the P type substrate 1, the PMOS 21 constituted of the drain 21a, the source 21b and the gate 21c, the NMOS 22 constituted of the drain 22a, the source 22b and the gate 22c, the active region 24 in the N type well 2 to be connected to the bias potential Vpp, and the active region 25 in the substrate 1 to be connected to the bias potential Vbb. Parasitic bipolar transistors 31, 32, 33, 34 and 35 as shown in FIG. 3 are provided in the output buffer 20. Transistors 31 and 32 serve as n-p-n type bipolar transistors and transistors 33 to 35 serve as p-n-p type bipolar transistors.

An ON voltage, that is, a built-in potential of the bipolar transistors is assumed as BP and a threshold voltage of the PMOS 21 as Vtp. If a positive surge voltage from the output terminal OUT rises up to approximately Vcc+BP when the higher potential Vpp than the potential Vcc is Vpp≦Vcc+(Vtp−BP), transistors 33 and 34 turn on before the PMOS 21 turns on. A current flowing through the transistor 34 flows to the side of the power supply Vcc and the current flowing through the transistor 33 flows into the substrate 1. In this case, the current flowing through the transistor 33 is larger than the current flowing through the transistor 34 since the potentials are different, and a greater part of the current flows in the substrate 1. A current supplying capacity of a bias potential Vbb generating circuit (not shown) is not so high because a stand-by current is controlled to be low. Therefore, when a current flowing into the substrate 1 due to the positive surge is compared with the current supplying capacity of the bias potential Vbb generating circuit, the current which flows into the substrate 1 is absolutely larger and, since the substrate resistance 36 is generally so large, the potential of the base of the transistor 31 steeply rises. Accordingly, when the current flows into the substrate 1, the potential Vbb of the substrate 1 steeply rises and the transistor 31 turns on.

If the back gate bias of the PMOS 21 is the power supply potential Vcc, a trigger current flows in the path of the power supply Vcc→N type well resistor 37→transistor 31→ground potential Vss. When the trigger current flows, a potential difference corresponding to the quantity of the trigger current is produced at both end points A and B of the N type well resistance 37, and the base potential of the transistor is lowered. Accordingly, the potential difference is produced between the base and the emitter of the transistor 35, and the transistor is turned on. Therefore, the current flows from the power supply potential Vcc to the substrate 1, and the potential Vbb of the substrate 1 rises again. Consequently, the current flows in the path of the power supply Vcc→N type well resistor 37→transistor 31→ground potential Vss, the potential difference between the points A and B further becomes large to finally result in the latch-up.

In this embodiment, however, the back gate bias of the PMOS 21 is the potential Vpp. As compared with a case that the back gate bias is connected to the potential Vcc, the base potential of transistor becomes higher when the trigger current flows. In other words, the current which flows in the transistor 35 is controlled and the latch-up tolerance is improved.

On the other hand, in case of potential Vpp≧Vcc+(Vtp−BP), the PMOS 21 turns on before transistors 33 and 34 turn on regardless of the positive surge voltage. Therefore, the current which flows due to the positive surge voltage flows into the side of the power supply Vcc through the PMOS 21 and the external terminal. In other words, the current does not flow into the substrate 1 and the latch-up can be prevented.

As described above, this embodiment enables to improve the latchup tolerance of the semiconductor device since the back gate bias of the PMOS 21 in the CMOS output buffer is set at the potential Vpp higher than the power supply potential Vcc. That is, the semiconductor device can be protected from damage due to the latch-up.

Second Embodiment

Figure 4A:
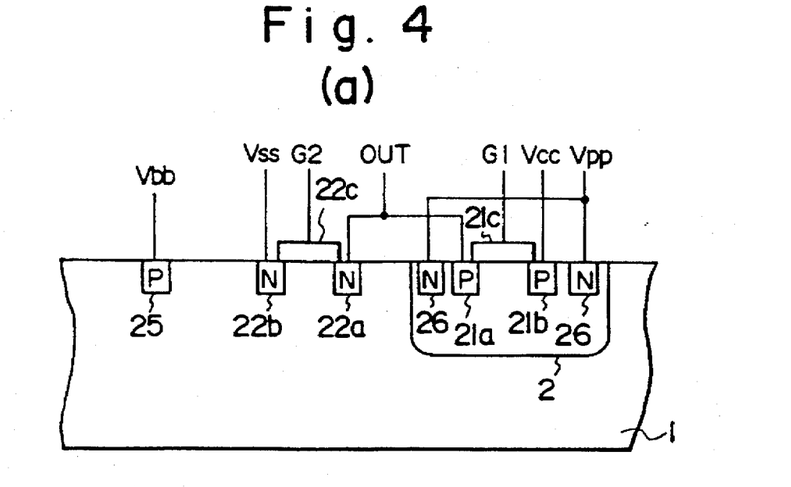
FIGS. 4a–4b are a cross sectional view illustrating a CMOS output buffer according to a second embodiment of the present invention.

FIGS. 4(a) and (b) are respectively a cross sectional view of the CMOS output buffer illustrating the second embodiment of the present invention and those element common to FIG. 2 are given the common symbols.

This embodiment is a semiconductor device for which the construction of the output buffer 20 in the first embodiment is modified and the constructions of other components are as same as in FIG. 2.

As in FIG. 2, the drain 21a and the source 21b of the PMOS 21 are formed in the N type well 2 formed on the P type substrate 1 and the gate 21c of the PMOS 21 is formed between the drain 21a and the source 21b. The drain 22a and the source 22b of the NMOS 22 are formed on the P type substrate 1 and the gate of the NMOS 22 is formed between the drain 22a and the source 22b. The P type substrate 1 is biased to the negative voltage Vbb to prevent the P type substrate from being forward biased to the N type well. In the CMOS output buffer shown in FIG. 4(a), the active region 24 for setting the back gate bias of the PMOS 21 in FIG. 2 is replaced by active regions 26a and 26b. The active regions 26a and 26b are formed so as to surround the PMOS 21 on the edge of the N type well where the PMOS 21 is formed.

Figure 4B:
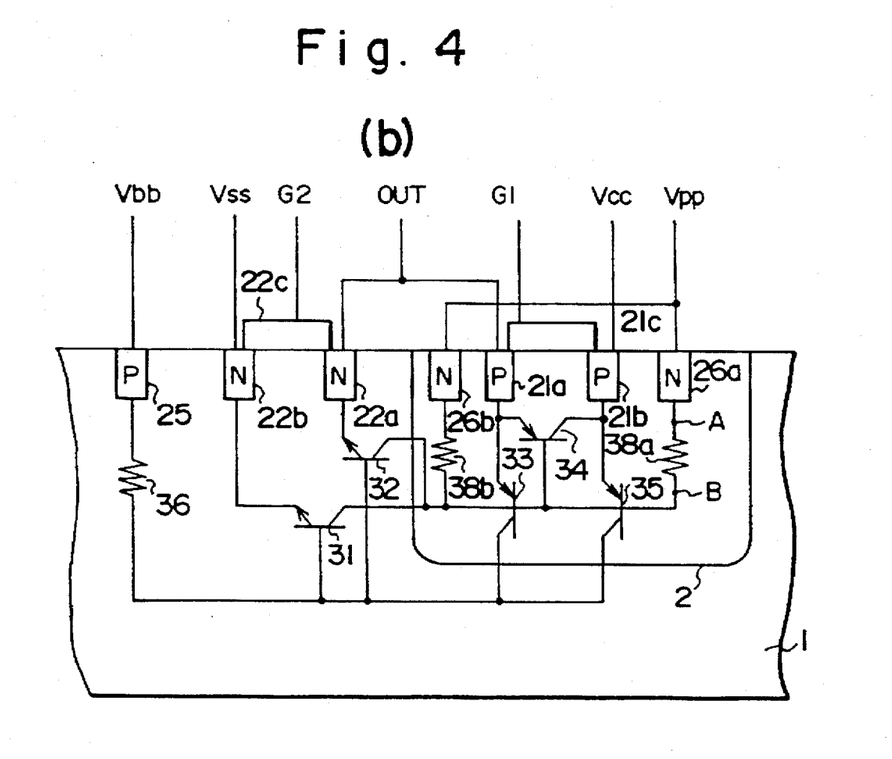
Figure 6:
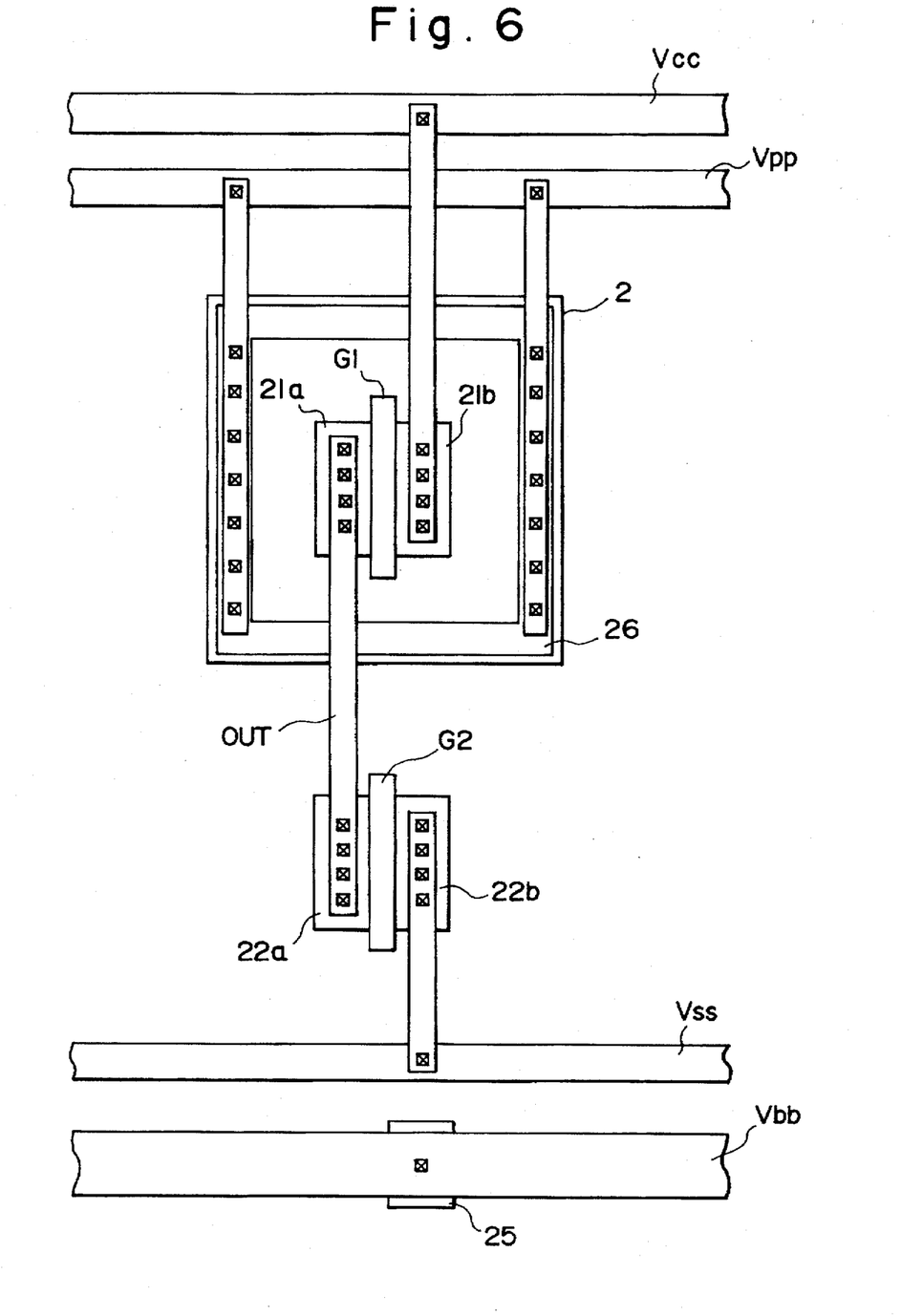
FIG. 6 is an example of a plan view in FIG. 4.

FIG. 6 is an example of a plan view in FIG. 4 where the active region 26 is formed so as to completely surround the PMOS 21.

The semiconductor device having this configuration operates as in the first embodiment. The data stored in the memory cells in, for example, the DRAM are read through the complementary bit line pair and the sense amplifier, and supplied to the output buffer control circuit 40. The output buffer control circuit 40 outputs data signals G1 and G2 corresponding to the read data to the gates 21c and 22c of PMOS 21 and NMOS 22, respectively. If both levels of data signals G1 and G2 are the ground potential Vss, the PMOS 21 turns on and the NMOS 22 turns off. Thus, a high level is output from the output terminal OUT. If both levels of data signals G1 and G2 are the power supply potential Vcc, the PMOS 21 turns off and the NMOS 22 turns on. Accordingly, a low level is output from the output terminal OUT.

The following describes the latch-up tolerance of the semiconductor device according to this embodiment.

Though parasitic bipolar transistors 31 to 35 as shown in FIG. 4(b) are provided on the PMOS 21 and the NMOS 22, the back gate bias of the PMOS 21 is set at the potential Vpp higher than the power supply potential Vcc and the latch-up tolerance is improved as in the first embodiment. Since the active regions 26a and 26b are formed so as to surround the PMOS 21, the resistance values of the N type well resistors 38a and 38b are smaller than that of the N type well resistor 37 in the first embodiment. Therefore, the base potential of transistors 33 and 35 are stably maintained at approximately potential Vpp level. Consequently, the current which flows into the substrate 1 is reduced and the latch-up tolerance is improved as compared with that in the first embodiment.

As described above, this embodiment enables to improve the latch-up tolerance of the semiconductor device as in the first embodiment since the back gate bias of the PMOS 21 in the CMOS output buffer 20 is set at the potential Vpp higher than the power supply potential Vcc. Since the active regions 26a and 26b for setting the back gate bias of the PMOS 21 are formed so as to surround the PMOS 21, the latch-up tolerance can be further improved.

Although FIG. 6 shows the example where the active region 26 is formed so as to completely surround the PMOS 21, the active region 26 may be formed so as to substantially surround the PMOS 21.

Figure 7:
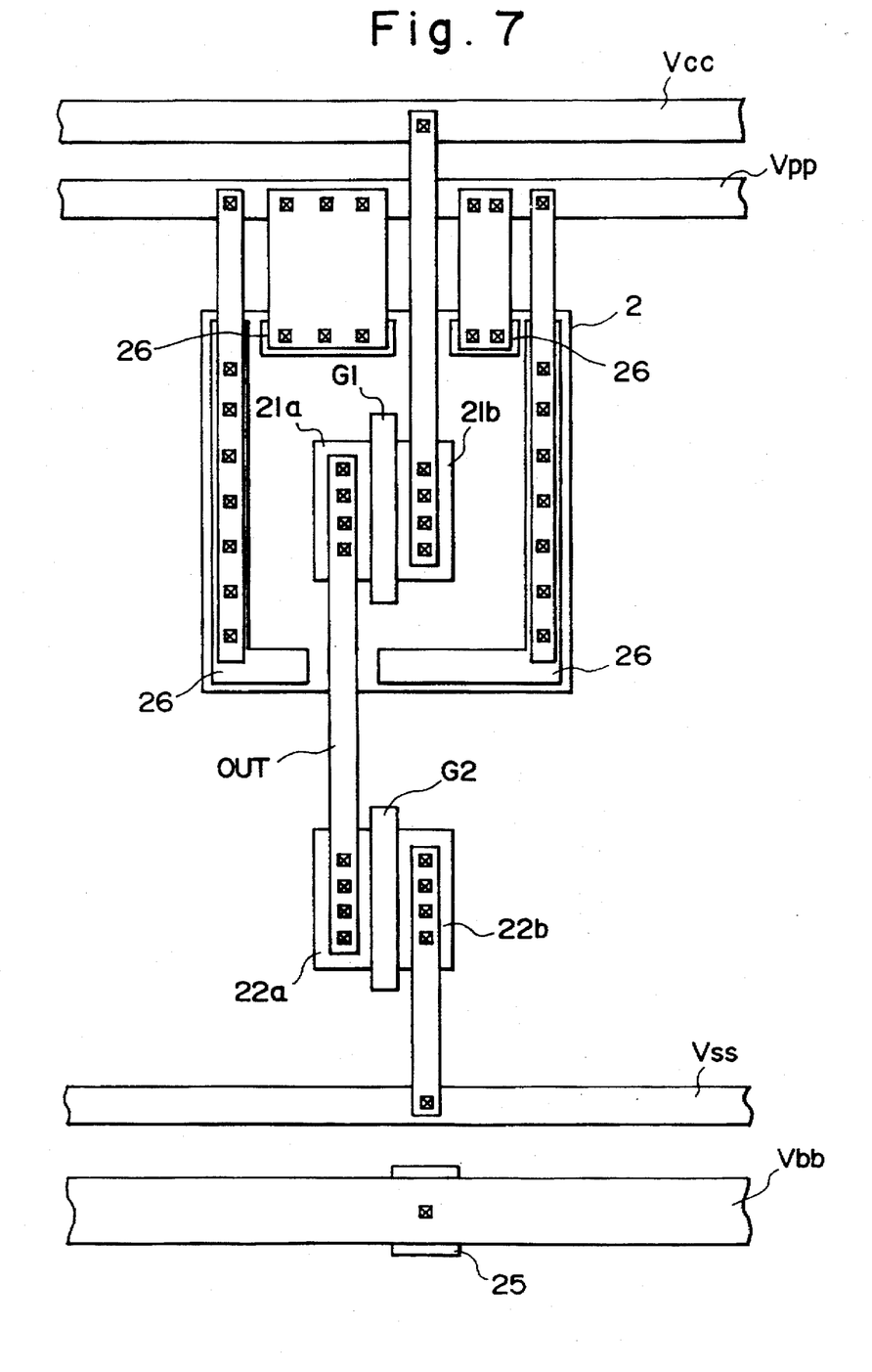
FIG. 7 is another example of a plan view in FIG. 4.

FIG. 7 shows another example of a plan view in FIG. 4 where the PMOS 21 is substantially surrounded by a diffusion layer to which the potential Vpp is supplied.

Third Embodiment

Figure 5A:
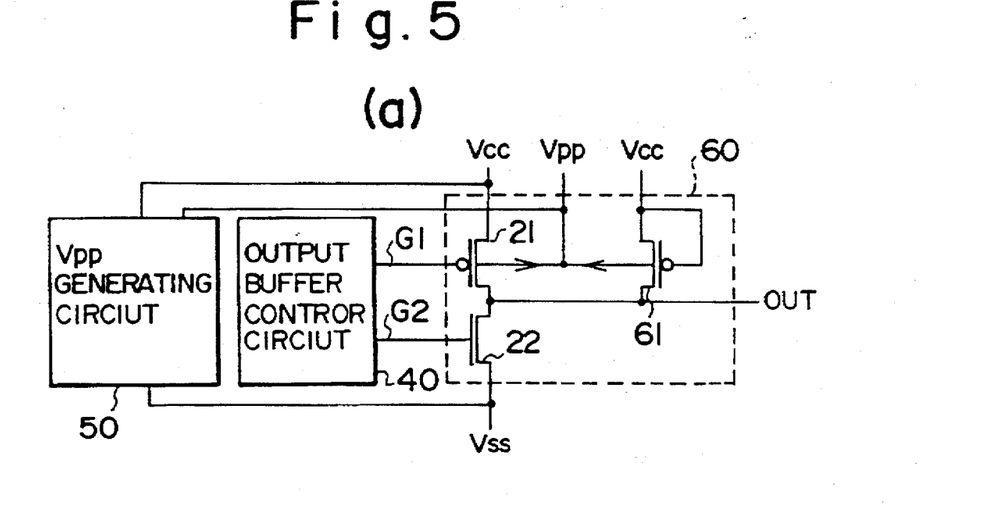
FIGS. 5a–5b are a diagram illustrating a main part of a semiconductor device according to a third embodiment of the present invention.
Figure 5B:
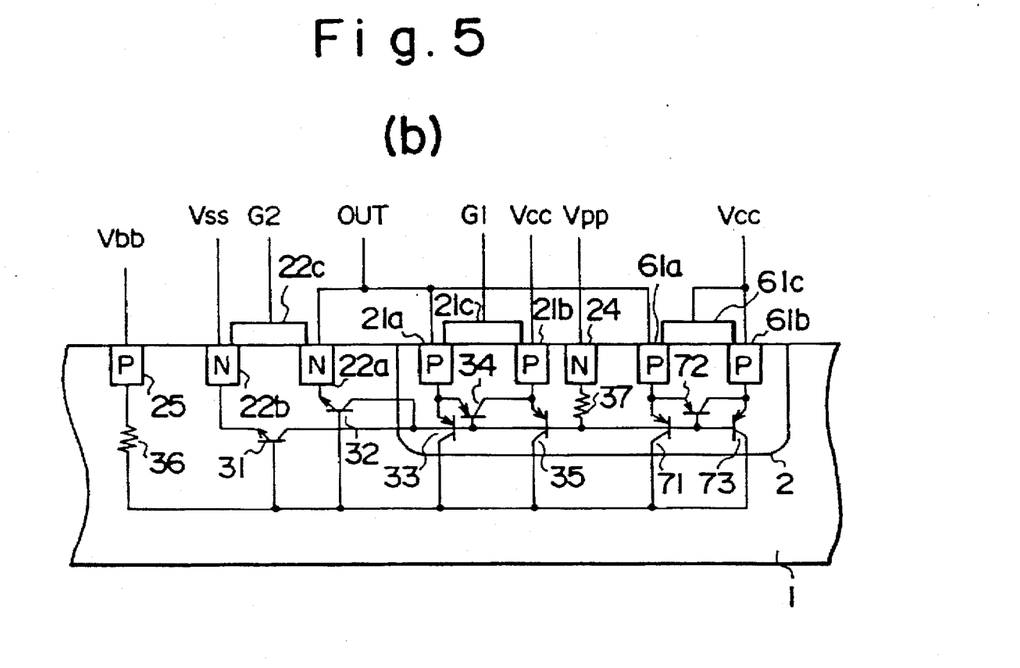

FIG. 5 shows a main part of a semiconductor device according to a third embodiment of the present invention, and those elements common to FIG. 2 are given common symbols. The CMOS output buffer and the peripheral circuit are shown in FIG. 5(a) and the cross sectional view of the CMOS output buffer is shown in FIG. 5(b).

The semiconductor device of this embodiment is provided with the output buffer control circuit 40 and the potential Vpp generating circuit 50 as in the first embodiment and an output buffer 60 different from the output buffer 20 is provided.

The CMOS output buffer 60 of this semiconductor device has the PMOS 21 and the NMOS 22 connected in series between the power supply potential Vcc and the ground potential Vss as in FIG. 1 and further has a PMOS 61 which constitutes a third MOS transistor. The drain of the PMOS 61 is connected to the drains of the PMOS 21 and the NMOS 22 and the source thereof is connected to the power supply potential Vcc. In other words, the PMOS 61 is connected in parallel with the PMOS 21 between the power supply potential Vcc and the drain of the NMOS 22. The gate of the PMOS 61 is connected to the power supply potential Vcc and the back gate bias of the PMOS 61 is set at the potential Vpp.

The PMOS 61 is provided and therefore a parasitic bipolar transistor as shown in FIG. 5(b) is formed in the N type well 2 in the CMOS output buffer 60. That is, the construction is such that parasitic bipolar transistors 71 to 73 are added to the parasitic bipolar transistors 31 to 35 shown in FIG. 3.

Also in the semiconductor device according to the present invention, as in the first and second semiconductor devices, the data stored in, for example, the memory cells in the DRAM are read through the complementary bit line pair and the sense amplifiers and supplied to the output buffer control circuit 40. The output buffer control circuit 40 outputs data signals G1 and G2 corresponding to the read data to the gates 21c and 22c of the PMOS 21 and the NMOS 22, respectively. When the levels of data signals G1 and G2 are the ground potential Vss, the PMOS 21 turns on and the NMOS 22 turns off. Therefore, the high level is output from the output terminal OUT. When the levels of the respective data signals G1 and G2 are the power supply potential Vcc, the PMOS 21 tuns off and the NMOS 22 turns on. Therefore, the low level is output from the output terminal OUT.

The following describes the latch-up tolerance in this semiconductor device.

In this embodiment, as in the first and second embodiments, the back gate bias of PMOS 21 and PMOS 61 is set at the potential Vpp higher than the power supply potential Vcc. Therefore, the latch-up tolerance is improved. In addition, In this embodiment, a parasitic bipolar transistor 72 is disposed and, when the positive voltage surge is produced, the current separately flows into the bipolar transistor 34 and the bipolar transistor 72 and the current from the output terminal OUT flows to the side of the power supply potential Vcc. Accordingly, the current which flows into the substrate 1 reduces. In other words, the latch-up trigger current is suppressed. The latch-up tolerance is further improved. If the gate width of the PMOS 61 increases, the effect is further improved.

As described above, in this embodiment, the PMOS connected in parallel with the PMOS 21 in the CMOS output buffer is provided. Therefore, the latch-up trigger current can be suppressed and the latch-up tolerance of the semiconductor device can be improved.

The present invention is not limited to the above-described embodiments and enables other various modifications and applications. Examples of such modifications and applications are as described below.

(1) In the first to third embodiments, the semiconductor device which is the DRAM is described. The latch-up phenomenon is a problem in all semiconductor devices which receive the CMOS output buffer and various types of measures are required. The present invention is applicable to all these semiconductor devices and enables to improve the latch-up tolerance in a simple configuration without taking special measures.

(2) In the second and third embodiments, as in the first embodiment, the back gate bias of the PMOS 21 is set at the potential Vpp higher than the power supply potential Vcc. However, the latch-up tolerance can similarly be improved better than the conventional one even when the back gate bias of the PMOS 21 is set at the power supply potential Vcc.

(3) Though the potential level of the substrate 1 is set at Vbb in the first to third embodiments, the present invention is applicable even when it is set at the ground potential Vss. In this case, the bias of the N type well 2 is set to be higher than the potential Vcc and, therefore, an effect that the leak current from the PMOS 21 and the PMOS 61 can be reduced is expected.

(4) Though the semiconductor device formed on the P type substrate 1 is described in the first to third embodiments, the present invention is applicable to the semiconductor device formed on the N type substrate.

As described in detail above, the first aspect of the invention is adapted so that the back gate bias of the first MOS transistor is set at the third power supply potential higher than the first power supply potential and therefore the base potential of the parasitic bipolar transistor disposed between the first MOS transistor and the substrate is higher than in the case that the back gate bias of the first MOS transistor is set at the first power supply potential. Accordingly, the current which flows in the parasitic transistor is suppressed and the latch-up tolerance in the semiconductor device can be improved.

According to the second aspect of the invention, since the active region for setting the back gate bias of the first MOS transistor is arranged so as to surround the first MOS transistor, the potential difference which occurs in the well resistor becomes small, the base potential of the parasitic bipolar transistor disposed between the first MOS transistor and the substrate becomes high, the current which flows in the parasitic bipolar transistor disposed between the first MOS transistor and the substrate is suppressed and the latch-up tolerance in the semiconductor device can be improved.

The third aspect of the invention is adapted so that a third MOS transistor is provided in parallel with the first MOS transistor and the first power supply potential or a potential higher than the first power supply potential is applied to the back gate of the third MOS transistor. Therefore, when the surge voltage is produced at the output terminal, the current separately flows in the first power supply potential through the parasitic bipolar transistor disposed between the drain and the source of the first MOS transistor and the parasitic bipolar transistor disposed between the drain and the source of the third MOS transistor, and the latch-up trigger current can be suppressed. Therefore the latch-up tolerance of the semiconductor device is improved.

What is claimed is:

1. A semiconductor device comprising:

a first MOS transistor of a first conductivity type;

a second MOS transistor of a second conductivity type;

said first MOS transistor and said second MOS transistor being coupled in series between a first voltage level and a second voltage level lower than said first voltage level; and a third MOS transistor of the first conductivity type connected in parallel with said first MOS transistor;

the gate of said third MOS transistor being coupled to said first voltage level and a back gate bias of the third MOS transistor being set at a third voltage level higher than the first voltage level.

2. A semiconductor device as set forth in claim 1, wherein said first MOS transistor and said second MOS transistor respectively constitute a CMOS output buffer for turning on or off in accordance with a potential applied to the respective gates and for generating output signals.

3. A semiconductor device as set forth in claim 1, wherein said first MOS transistor and said third MOS transistor of the first conductivity type are respectively a PMOS transistor and said second MOS transistor of the second conductivity type is an NMOS transistor.

4. A semiconductor device as set forth in claim 1, wherein said semiconductor device is formed in a DRAM.

5. A semiconductor device comprising:

a semiconductor substrate of a first conductivity type;

a first region of a second conductivity type formed in said semiconductor substrate;

a first MOS transistor of the second conductivity type formed in said semiconductor substrate except for said first region and having a first electrode coupled to a first voltage level, a second electrode, and a gate electrode;

a second MOS transistor of the first conductivity type formed in said first region and having a first electrode coupled to the second electrode of said first MOS transistor, a second electrode coupled to a second voltage level higher than the first voltage level, and a gate electrode; and a second region of the second conductivity type applied to a third voltage level higher than the second voltage level, formed in said first region and substantially surrounding said second MOS transistor in a plan view of the device.

6. A semiconductor device as set forth in claim 5, wherein said second region completely surrounds said second MOS transistor.

7. A semiconductor device as set forth in claim 15, wherein said first MOS transistor and said second MOS transistor respectively comprise a CMOS output buffer for turning on or off in accordance with a voltage level applied to the respective gates and for generating output signals.

8. A semiconductor device as set forth in claim 5, wherein said first MOS transistor is an NMOS transistor and said second MOS transistor is a PMOS transistor.

9. A semiconductor device as set forth in claim 5, wherein said semiconductor device is formed in a DRAM.

10. A semiconductor device as set forth in claim 5, wherein said second region has a plurality of contact portions, each of the contact portions is coupled to a wiring which is applied to the third voltage level.

11. A semiconductor device comprising:

a semiconductor substrate of a first conductivity type;

a first region of a second conductivity type formed in said semiconductor substrate;

a first MOS transistor of the second conductivity type formed in said semiconductor substrate except for said first region and having a first electrode coupled to a first voltage level, a second electrode, and a gate electrode;

a second MOS transistor of the first conductivity type formed in said first region and having a first electrode coupled to the second electrode of said first MOS transistor, a second electrode coupled to a second voltage level higher than the first voltage level, and a gate electrode;

a third MOS transistor of the first conductivity type formed in said first region and having a first electrode coupled to the second electrode of said first MOS transistor, a second electrode coupled to the second voltage level, and a gate electrode coupled to the second voltage level; and a second region of a second conductivity type formed in said first region and applied to a third voltage level higher than the second voltage level.

12. A semiconductor device as set forth in claim 11, wherein said first MOS transistor and said second MOS transistor respectively comprise a CMOS output buffer for turning on or off in accordance with a voltage level applied to the respective gates and for generating output signals.

13. A semiconductor device as set forth in claim 11, wherein said first MOS transistor is an NMOS transistor and said second and third MOS transistors are PMOS transistors.

14. A semiconductor device as set forth in claim 11, wherein said semiconductor device is formed in a DRAM.

* * * * *